United States Patent
Yamamoto et al.

(10) Patent No.: US 6,889,738 B2
(45) Date of Patent: May 10, 2005

(54) METHOD AND APPARATUS FOR DETERMINING PROCESSING SIZE OF BONDING MATERIAL

(75) Inventors: Akihiro Yamamoto, Kobe (JP); Sakae Kobayashi, Hirakata (JP); Shinzou Eguchi, Kyotanabe (JP); Kazuhiro Murata, Nara (JP); Kouichi Yoshida, Moriguchi (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 59 days.

(21) Appl. No.: 10/614,784

(22) Filed: Jul. 9, 2003

(65) Prior Publication Data
US 2004/0069397 A1 Apr. 15, 2004

(30) Foreign Application Priority Data
Jul. 10, 2002 (JP) .................................. 2002-200971
Jul. 4, 2003 (JP) .................................. 2003-192147

(51) Int. Cl.[7] .......................................... B32B 31/20
(52) U.S. Cl. .................. 156/353; 156/358; 156/359; 156/360; 156/367; 156/378; 156/379
(58) Field of Search ................ 156/353, 359, 156/360, 367, 378, 379, 521, 358, 64, 361; 118/677; 29/833, 835; 83/73.5, 76.4, 364; 700/302, 303; 702/97, 101, 158

(56) References Cited

U.S. PATENT DOCUMENTS 5,711,989 A * 1/1998 Ciardella et al. .............. 427/96
6,023,666 A * 2/2000 Jiang et al. .................. 702/173

FOREIGN PATENT DOCUMENTS

JP          8-107268          4/1996

* cited by examiner

Primary Examiner—Chris Fiorilla
Assistant Examiner—George Koch
(74) Attorney, Agent, or Firm—Wenderoth, Lind & Ponack, L.L.P.

(57) ABSTRACT

An apparatus and method determine a size of a bonding film for bonding a bonding target having a size which varies due to temperature variation, at an environmental temperature which is different from a temperature during use. The method includes measuring an actual size of the bonding portion of the circuit electrode at the first temperature, comparing the actual size of the bonding portion with a designed size of the bonding portion at the first temperature, and determining a cutting size of the bonding material based on a comparison result and mounting the bonding material over the bonding portion.

10 Claims, 14 Drawing Sheets

F I G. 1 2  PRIOR ART

METHOD AND APPARATUS FOR DETERMINING PROCESSING SIZE OF BONDING MATERIAL

BACKGROUND OF THE INVENTION

1. Field of the Invention

The present invention relates to a bonding method for bonding circuit electrodes of a display panel for use in a liquid crystal display, a plasma display, or the like, to electrodes on a printed board forming electronic circuitry for driving the display panel. The, present invention also relates to a bonding apparatus for use with the same method.

2. Description of the Background Art

A display panel for use in a liquid crystal display, a plasma display, or the like, is structured such that a display section and circuit electrodes, which receive signals for driving pixels of the display section, are formed on a glass substrate. There is a known method for connecting the circuit electrodes of the display panel to the electrodes on the printed board for outputting signals for driving the display panel. In this method, the display panel and the printed board are bonded together using an anisotropic conductive film (see, for example, Japanese Patent Laid-Open Publication No. 8-107268).

A conventional circuit electrode bonding method is described below with reference to FIGS. 11 and 12. FIG. 11 is a view illustrating a display panel 1 and a printed board 6 which are bonded together using an anisotropic conductive film 4. FIG. 12 is an enlarged view of a portion of the display panel 1 illustrated in FIG. 11.

The display panel 1 includes a glass substrate, a display section 1a for displaying an image, and sets of a plurality of circuit electrodes 2 for receiving signals for driving the display section 1a. The display section 1a and the sets of a plurality of circuit electrodes 2 are provided on the glass substrate, such that the sets of a plurality of circuit electrodes 2 are positioned on the periphery of the display section 1a. As illustrated in FIG. 12, there are bonding portions 8 each provided in an area between one of the printed boards 6 and a set of a plurality of circuit electrodes 2. The number of bonding portions 8 to be provided is the same as the number of printed boards 6 to be bonded to the display panel 1. Alignment marks 3a and 3b are provided on opposite sides of each of the bonding portions 8, and used for detecting the location of that bonding portion 8.

The display panel 1 and each of the printed boards 6 are bonded together by subjecting the anisotropic conductive film 4 to a thermocompression process. The thermocompression process imparts, to compressed portions, conductive properties in a through-plane direction (a thickness direction) and insulative properties in an in-plane direction (a length direction).

Each of the printed boards 6 is provided with a conductor 7 and alignment marks 5a and 5b. The alignment marks 5a and 5b are used for detecting the location of that printed board 6. Since each of the printed boards 6 is bonded to a corresponding one of the bonding portions 8 via the anisotropic conductive film 4, a set of the plurality of circuit electrodes 2 and the conductor 7 of that printed board 6 are electrically connected via the anisotropic film 4.

Next, a method for determining the size and an attaching location of the anisotropic conductive film 4 is described with reference to FIG. 12. In FIG. 12, sizes regarding the alignment marks 3a and 3b, the bonding portion 8, and the anisotropic conductive film 4 are indicated by alphabetic characters. Specifically, L indicates an interval between a set of alignment marks 3a and 3b, M indicates a length of the bonding portion 8, P indicates a pitch between adjacent bonding portions 8, X indicates a distance between an alignment mark 3a and its corresponding anisotropic conductive film 4, and N indicates a length of the anisotropic conductive film 4.

In order for the anisotropic conductive film 4 to cover the bonding portion 8, length N of the anisotropic conductive film 4 is set so as to be longer than length M of the bonding portion 8. A difference N−M in length between the anisotropic conductive film 4 and the bonding portion 8 is provided as a margin for allowing the anisotropic conductive film 4 to completely cover the bonding portion 8. Accordingly, by making the difference N−M larger, it is ensured that the bonding portion 8 is completely covered. However, when the difference N−M is too large, the anisotropic conductive film 4 comes into contact with the alignment marks 3a and/or 3b, and therefore a set of alignment marks 3a and 3b cannot be properly detected. Accordingly, length N of the anisotropic conductive film 4 should be set so as to be longer than length M of the bonding portion 8 and shorter than interval L between the set of alignment marks 3a and 3b. That is, a relationship M<N<L is satisfied.

By attaching the anisotropic conductive film 4 such that its center is positioned at a midpoint between the set of alignment marks 3a and 3b, it is made possible to minimize an undesirable possibility that the anisotropic conductive film 4 might come into contact with the alignment marks 3a and/or 3b. Accordingly, the location in which the anisotropic conductive film 4 is attached is set such that distance X between the anisotropic conductive film 4 and the alignment mark 3a is X=(L−N)÷2.

Next, a conventional bonding apparatus for bonding the bonding portion 8 and the printed board 6 together is described with reference to FIG. 13. In FIG. 13, a bonding apparatus B includes: a designed size storing section 108; an input section 122; a control section 124; a film cutting section 202; a film attaching section 204; a printed board attaching section 206; a display panel transfer section 208; and a heating and pressurizing section 210.

The designed size storing section 108 stores designed sizes (Nt, Xt, Pt) regarding length N of the anisotropic conductive film 4, distance X between the alignment mark 3a and the anisotropic conductive film 4, and pitch P between bonding portions (hereinafter, referred to as the "bonding portion pitch P"). The film cutting section 202 reads length Nt of the anisotropic conductive film 4 from the designed size storing section 108, and cuts an anisotropic conductive film 4 to length Nt. The film attaching section 204 attaches the resultant anisotropic conductive film 4 onto a first piece of bonding portions 8 so as to be distanced by Xt from the alignment mark 3a.

Upon completion of the attachment of the anisotropic conductive film 4 to the first piece of bonding portions 8, the printed board attaching section 206 uses a camera (not shown) to detect the alignment marks 3a and 3b, and attaches the first piece of bonding portions 8 to the printed board 6 such that the alignment marks 3a and 3b are aligned with alignment marks 5a and 5b, respectively, of the printed board 6 in a prescribed positional relationship.

Upon completion of the attachment of both the anisotropic conductive film 4 and the printed board 6 onto the first piece of bonding portions 8, the display panel transfer section 208 moves the display panel 1 by a distance of pitch Pt. Then, another operation is started to attach an anisotropic conductive film 4 and a printed board 6 to the next piece of bonding portions 8.

The heating and pressurizing section 210 pressurizes and heats the anisotropic conductive film 4, which is attached between the bonding portion 8 and the printed board 6 in the above-described manner, using a known method. As a result of this, the bonding portion 8 and the printed board 6 are bonded together, and therefore circuit electrodes 2 on which the bonding portion 8 is provided are electrically connected to the conductor 7 on the printed board 6.

In the step of attaching the anisotropic film 4 to the display panel 1, the temperature of the display panel 1 occasionally rises as high as the anisotropic film 4 and is thermally expanded. Accordingly, the actual distance L between alignment marks 3a and 3b, and the actual length M of the bonding portion 8 can be varied in accordance with variation in temperature and a thermal expansion coefficient of the display panel 1. However, there are variations in temperature distribution and composition among display panels 1, and therefore the actual distance between alignment marks 3a and 3b has an error ΔL' with respect to the designed size L. In the case where the value of error ΔL' is considerable, there occurs a malfunction such that the anisotropic conductive film contacts the alignment marks 3a and/or 3b, or is not sufficiently large as to cover the bonding portion 8.

Further, when an anisotropic conductive film 4 cut to a proper length at room temperature is attached to the display panel 1 having a high temperature, heat of the display panel 1 is conducted to the anisotropic conductive film 4, and therefore the anisotropic conductive film 4 is elongated by thermal expansion. Accordingly, in some cases, the length of the anisotropic conductive film 4 and the distance L between the alignment marks 3a and 3b, which are properly set at room temperature, can be varied, so that the anisotropic conductive film 4 after being attached may be in contact with the alignment marks 3a and/or 3b.

Furthermore, even in the case where no malfunction is caused in the step of attaching the anisotropic conductive film 4 to the display panel 1 having a high temperature, the display panel 1 and the anisotropic conductive film 4 are shrunk when cooled down to room temperature. Accordingly, a difference (N−M) in length between the anisotropic conductive film 4 and the bonding portion 8 varies by difference C' in length shrunk by temperature drop to the room temperature. Therefore, even if a positional relationship between the anisotropic conductive film 4 and the bonding portion 8 is properly set in an attaching operation, such a positional relationship varies during use. When length N of the anisotropic conductive film 4 becomes shorter than length M of the bonding portion 8, connections between the circuit electrodes 2 and the conductor 7 are not secured.

Further still, length N of the anisotropic conductive film 4 attached to the display panel 1 is varied due to variation in operation of a device for cutting the anisotropic conductive film 4 or due to deformation of the anisotropic conductive film 4 by pressure applied for attaching the anisotropic conductive film 4. The actual length of the anisotropic conductive film 4 attached to the bonding portion 8 has processing error D' with respect to its designed size resulted from variation among step capabilities. Specifically, in the case where the processing error D' is considerable, there occurs a malfunction such that the anisotropic conductive film 4 does not sufficiently cover the bonding portion 8, or the anisotropic conductive film 4 contacts the alignment marks 3a and/or 3b.

Thus, even if the anisotropic film 4 is cut to a designed size for an environmental temperature in an attaching operation of a processing step, and attached in a prescribed location, it is not ensured that the anisotropic film 4 has a proper length and is attached in a proper location under a temperature environment during use.

SUMMARY OF THE INVENTION

Therefore, an object of the present invention is to provide an apparatus and method for determining a size of a bonding film for bonding a bonding target having a size which varies due to temperature variation, at an environmental temperature which is different from a temperature during use.

In order to attain the object mentioned above, according to the present invention, a designed size of a bonding portion on circuit electrodes is compared with a measured size of the bonding portion, a size of a bonding material is determined based on a comparison result, and the bonding material having a determined size is provided over the bonding portion. Provision of the bonding material is performed in consideration of locations of other bonding portions adjacent to the bonding portion over which the bonding material is provided, and the locations of such bonding portions are estimated based on the above-mentioned comparison result. The present invention eliminates the occurrence of malfunction such that an alignment mark is covered by the bonding material. Thus, alignment precision can be prevented from being lowered, and therefore a high-quality method and apparatus for bonding circuit electrodes can be provided.

A first aspect of the present invention is directed to a circuit electrode bonding method for bonding a bonding portion of a circuit electrode to a bonding material in an environment at a first temperature, the bonding portion and the bonding material being used in an environment at a second temperature which is different from the first temperature, the method comprising the steps of: measuring an actual size of the bonding portion of the circuit electrode at the first temperature; comparing the actual size of the bonding portion with a designed size of the bonding portion at the first temperature; and determining a cutting size of the bonding material based on a comparison result and mounting the bonding material over the bonding portion.

Thus, a formation error is calculated by comparing the measured size of the formed bonding portion to a designed size, and the size of the bonding material and the location of an adjacent bonding portion are obtained based on a calculated value, whereby it is possible to obtain an exact location for bonding.

These and other objects, features, aspects and advantages of the present invention will become more apparent from the following detailed description of the present invention when taken in conjunction with the accompanying drawings.

DESCRIPTION OF THE PREFERRED EMBODIMENTS

Before providing a detailed description about a processing size determination device according to an embodiment of the present invention, the basic concept of the present invention will be described. As described above in conjunction with the prior art, sizes of a bonding portion 8 and an anisotropic conductive film 4 provided on a display panel 1 vary due to temperature variation.

Figure 14:
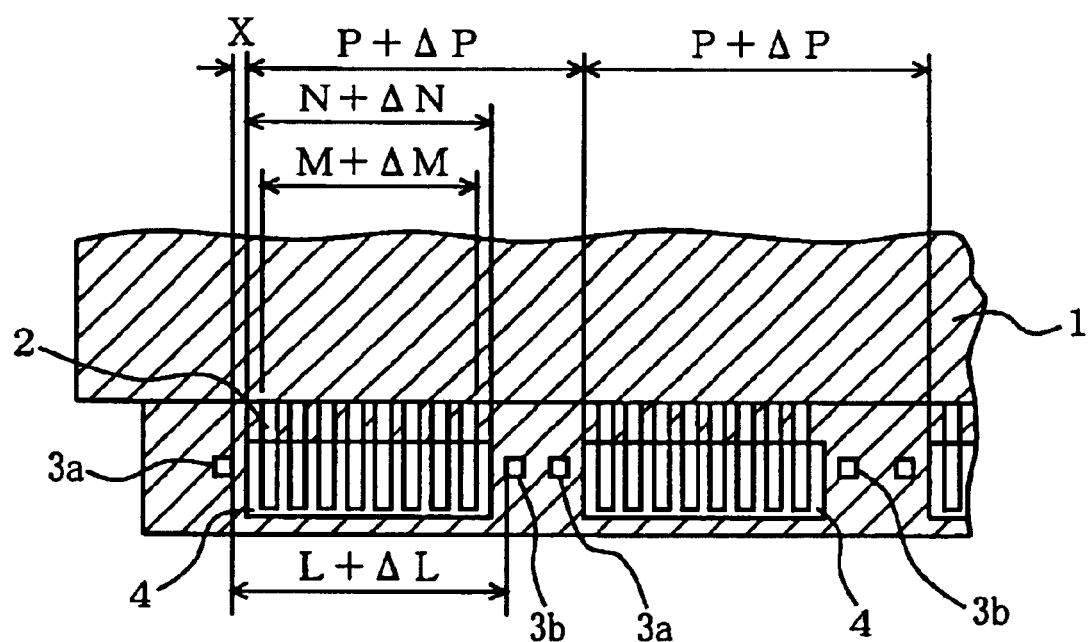
FIG. 14 is a schematic view showing actual sizes of a bonding portion of a display panel and an anisotropic conductive film.

The length of the bonding portion 8 is significantly influenced by non-repeatable factors, such as the composition of the display panel 1, which varies for each display panel, and variation in temperature distribution. Regarding a distance between alignment marks, a length of a bonding portion, and a pitch between bonding portions, the display panel 1 has errors resulted from variation in thermal expansion level. FIG. 14 is a view showing the actual length and attaching location of an anisotropic conductive film 4. In FIG. 14, a distance (L+ΔL) between alignment marks (hereinafter, referred to as the "alignment mark distance"), length (M+ΔM) of a bonding portion, a pitch (P+ΔP) between bonding portions (hereinafter, referred to as the "bonding portion pitch"), and a length (N+ΔN) of an anisotropic conductive film are indicated as actual sizes. Here, L, M, N, and P are sizes designed for a temperature in an attaching step, and ΔL, ΔM, ΔN, and ΔP are errors with respect to corresponding designed sizes.

For example, ΔL represents an error between designed size L and the actual size in an attaching step with respect to a distance between a set of alignment marks 3a and 3b. The error ΔL is resulted from variation in thermal expansion among display panels due to variation in temperature distribution, variation in composition among the display panels, etc. at an environmental temperature in the attaching step.

Each of error ΔM in bonding portion length (M+ΔM) and error ΔP in bonding portion pitch (P+ΔP) is caused by thermal expansion of the display panel, and ratios of these errors to corresponding designed sizes are equivalent. Thus, by obtaining and using a ratio of designed size L to an alignment mark distance (L+ΔL) actually measured at a temperature during the attaching step, it is made possible to calculate the bonding portion length (M+ΔM) and the bonding portion pitch (P+ΔP).

Even if a positional relationship between the bonding portion 8 and the anisotropic conductive film 4 is set such that the bonding portion 8 and the anisotropic conductive film 4 have lengths proper for the temperature during the attaching step, the set positional relationship is impaired due to temperature variation. In such a case, variation in the positional relationship between the bonding portion 8 and the anisotropic conductive film 4 corresponds to a difference in amount of variation of sizes of the bonding portion 8 and the anisotropic conductive film 4 which varies in accordance with variations in thermal expansion coefficients and temperature levels of the bonding portion 8 and the anisotropic conductive film 4. Therefore, the variation in the positional relationship between the bonding portion 8 and the anisotropic conductive film 4 due to temperature variation can be theoretically obtained based on the thermal expansion coefficients and a difference between temperature levels. For example, by calculating size variation C due to temperature variation, it is made possible to correct sizes of the bonding portion 8 and the anisotropic conductive film 4 designed for the attaching step.

Further, the positional relationship between the bonding portion 8 and the anisotropic conductive film 4 varies due to variation in processing operation, such as variation in cutting size to which the anisotropic conductive film 4 is actually cut, or variation in attaching pressure in the step of attaching the anisotropic conductive film 4. Such a variation of the positional relationship between the bonding portion 8 and the anisotropic conductive film 4, which is caused due to a process capability, may be undesirably repeated unless the process capability is improved. Accordingly, by previously specifying an error in size of the anisotropic conductive film 4 due to the process capability, it is made possible to correct the cutting size and the attaching location of the anisotropic conductive film 4.

As described above, regarding errors which influence the positional relationship between the bonding portion 8 and the anisotropic conductive film 4, a degree of influence can be obtained in accordance with a method suitable for each of different factors. According to the present invention, a cutting size of the anisotropic conductive film 4 is corrected based on the above-described technical concept, and therefore it is ensured that the anisotropic conductive film 4 having a proper length is bonded in a suitable location both in the attaching step and during use.

First Embodiment

Figure 1:
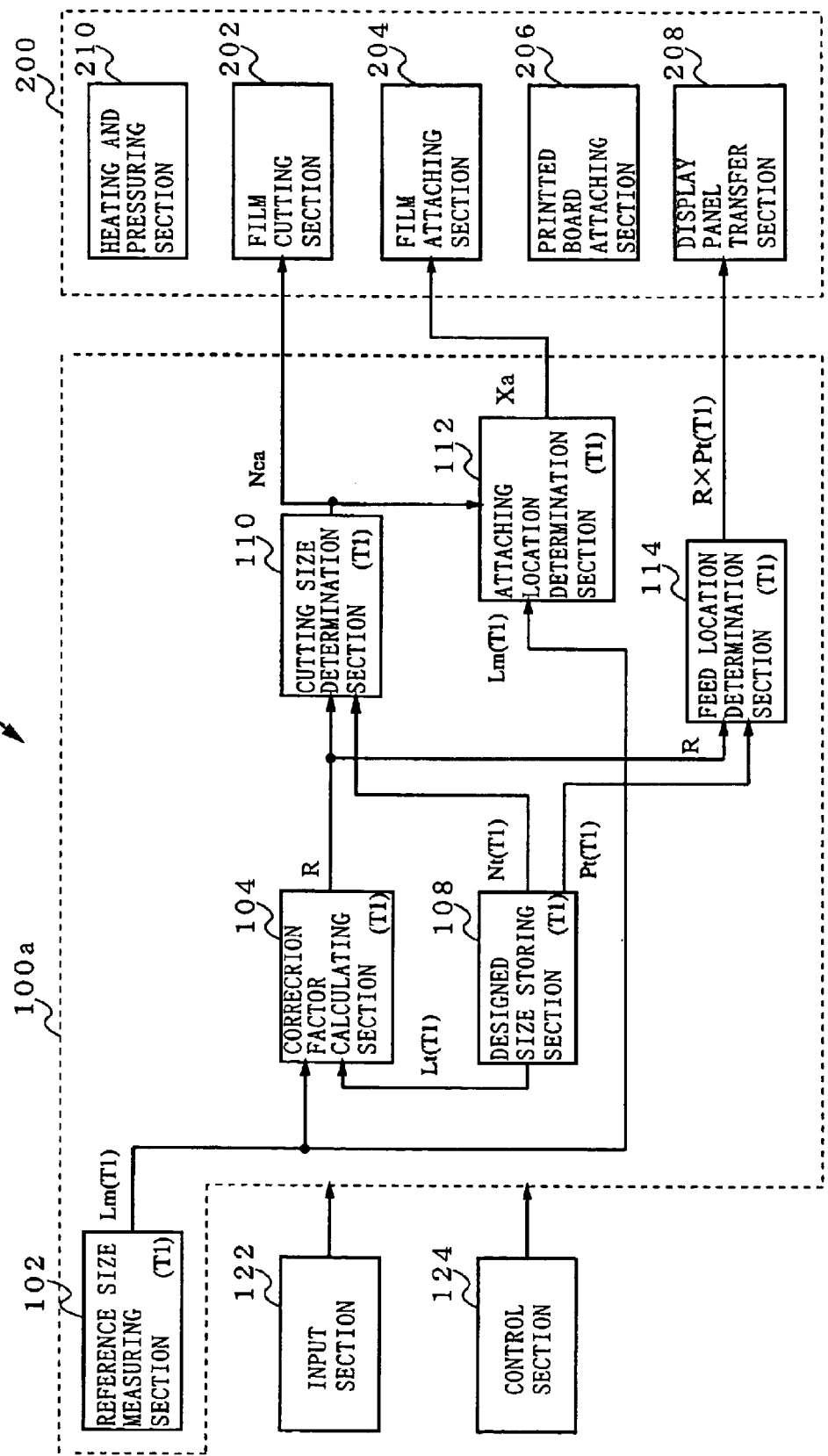
FIG. 1 is a block diagram illustrating a configuration of a bonding apparatus according to a first embodiment of the present invention having a processing size determination device incorporated therein.

Referring to FIG. 1, described below is a bonding apparatus Aa according to a first embodiment of the present invention having a processing size determination device incorporated therein. The bonding apparatus Aa includes a processing size determination section 100a and a processing operation section 200.

The bonding apparatus Aa uses an anisotropic conductive film 4 as a bonding material for bonding a printed board 6 to a bonding portion 8 of a display panel 1. The bonding apparatus Aa cuts the anisotropic conductive film 4 to a length, which is suitable for the bonding portion 8 in the attaching step where the display panel 1 has temperature T1. Then, the bonding apparatus Aa bonds the resultant anisotropic conductive film 4 to the bonding portion 8 of the display panel 1. In the present embodiment, it is assumed that the temperature T1 of the display panel 1 in the attaching step is set at about 80° C. Specifically, the anisotropic conductive film 4 is cut at room temperature (about 25° C.), and attached to the display panel 1 at 80° C.

The processing size determination section 100a determines the length and the attaching location of the anisotropic conductive film 4. The processing operation section 200 performs an operation of bonding the display panel 1 and the printed board 6 together based on sizes determined by the processing size determination section 100a.

The processing size determination section 100a includes a reference size measuring section 102, a correction factor calculating section 104, a designed size storing section 108, a cutting size determination section 110, an attaching location determination section 112, a feed location determination section 114, an input section 122, and a control section 124.

Figure 2:
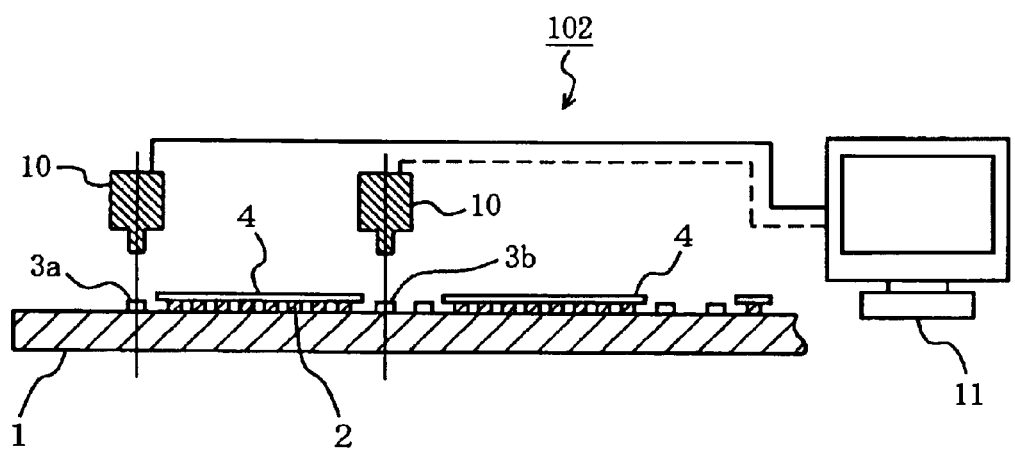
FIG. 2 is a view illustrating an example of a specific configuration of a reference size measuring section 102 illustrated in FIG. 1.

The reference size measuring section 102 measures a reference size Lm (T1) which is typical of sizes of bonding portions 8 at temperature T1. In the present embodiment, the reference size Lm (T1) corresponds to the alignment mark distance (L+ΔL) indicated in FIG. 14. Referring to FIG. 2, a detailed structure of the reference size measuring section 102 is described. The reference size measuring section 102 illustrated in FIG. 2 includes a camera 10 and a calculation control device 11. The camera 10 captures an image of an alignment mark 3a at a first prescribed capturing position, and then moves to a second prescribed capturing position to capture an image of an alignment mark 3b.

The calculation control device 11 calculates a distance between the alignment marks 3a and 3b based on the images of the alignment marks 3a and 3b captured by the camera 10 and a distance between the first and second prescribed capturing positions. It should be noted that the images of the alignment marks 3a and 3b may be captured by two cameras respectively placed at the first and second prescribed capturing positions.

The designed size storing section 108 prestores the following designed sizes for temperature T1: alignment mark distance Lt (T1) which is a distance between the alignment marks 3a and 3b; length Nt (T1) of the anisotropic conductive film 4; and bonding portion pitch Pt (T1).

The correction factor calculating section 104 reads the alignment mark distance Lt (T1) from the designed size storing section 108, and calculates correction factor R which corresponds to a ratio of the reference size Lm (T1) measured by the reference size measuring section 102 to the designed size Lt (T1). The correction factor R is represented by the following expression 1.

$$R = Lm(T1) \div Lt(T1) \quad (1)$$

The cutting size determination section 110 reads the length Nt (T1) of the anisotropic conductive film 4 from the designed size storing section 108, and calculates the actual length R×Nt(T1) of the anisotropic conductive film 4 at a temperature T1 (about 80° C.) based on the correction factor R and the designed size Nt(T1). R×Nt(T1) corresponds to the length N+ΔN indicated in FIG. 14, and represents the length of the anisotropic film 4, which is corrected so as to be suitably adapted for the alignment mark distance Lm (T1) at the temperature T1.

The cutting size determination section 110 determines cutting size Nca to which the anisotropic conductive film 4 is cut at a temperature of about 25° C., such that the length of the anisotropic conductive film 4 can be R×Nt(T1) at the temperature T1. Specifically, the length Nt(T1) is corrected based on the thermal expansion coefficient of the anisotropic conductive film 4 and a difference in temperature between cutting and attaching operations.

The attaching location determination section 112 determines a location in which the anisotropic conductive film 4 is attached, based on the distance Lm(T1) between the alignment marks 3a and 3b measured by the reference size measuring section 102, and the cutting size Nca. Specifically, the attaching location determination section 112 sets a distance Xa from the alignment mark 3a to the anisotropic conductive film 4 such that the center of the anisotropic conductive film 4 is positioned at a midpoint between the alignment marks 3a and 3b. The distance Xa from the alignment mark 3a to the anisotropic conductive film 4 is obtained by the following expression 2.

$$Xa = (Lm(T1) - Nca) \div 2 \quad (2)$$

The feed location determination section 114 reads the designed size Pt(T1) of a bonding portion pitch from the designed size storing section 108, and calculates the actual size R×Pt(T1) of the bonding portion pitch at the temperature T1, based on the correction factor R and the designed size Pt(T1) of the bonding portion pitch. The actual size R×Pt(T1) of the bonding portion pitch at the temperature T1 corresponds to the pitch P+ΔP indicated in FIG. 14.

The input section 122 is used for data entry of designed sizes to be prestored. The control section 124 controls each section of the bonding apparatus Aa.

The processing operation section 200 includes a film cutting section 202, a film attaching section 204, a printed board attaching section 206, a display panel transfer section 208, and a heating and pressurizing section 210.

The film cutting section 202 cuts the anisotropic conductive film 4 to the cutting size Nca determined by the cutting size determination section 110. In general, the film cutting section 202 uses a cutter or a laser beam. However, other means may be used by the film cutting section 202.

The film attaching section 204 attaches to the bonding portion 8 the anisotropic conductive film 4 cut by the film cutting section 202. The printed board attaching section 206 attaches a printed board 6 to the anisotropic conductive film 4 attached to the display panel 1, such that the bonding portion 8 faces a conductor 7 on the printed board 6 and comes into contact therewith, and alignment marks 3a and 3b of the display panel 1 are aligned with alignment marks 5a and 5b, respectively, of the printed board 6 in a prescribed positional relationship.

The heating and pressurizing section 210 heats and pressurizes the anisotropic conductive film 4 such that the display panel 1 and the printed board 6 are bonded together via the anisotropic conductive film 4. In general, electric heating, in which temperature can be fixed, or high-frequency heating, in which temperature rising and heating can be instantly realized, is used as a heating method. However, other methods may be used.

Figure 3:
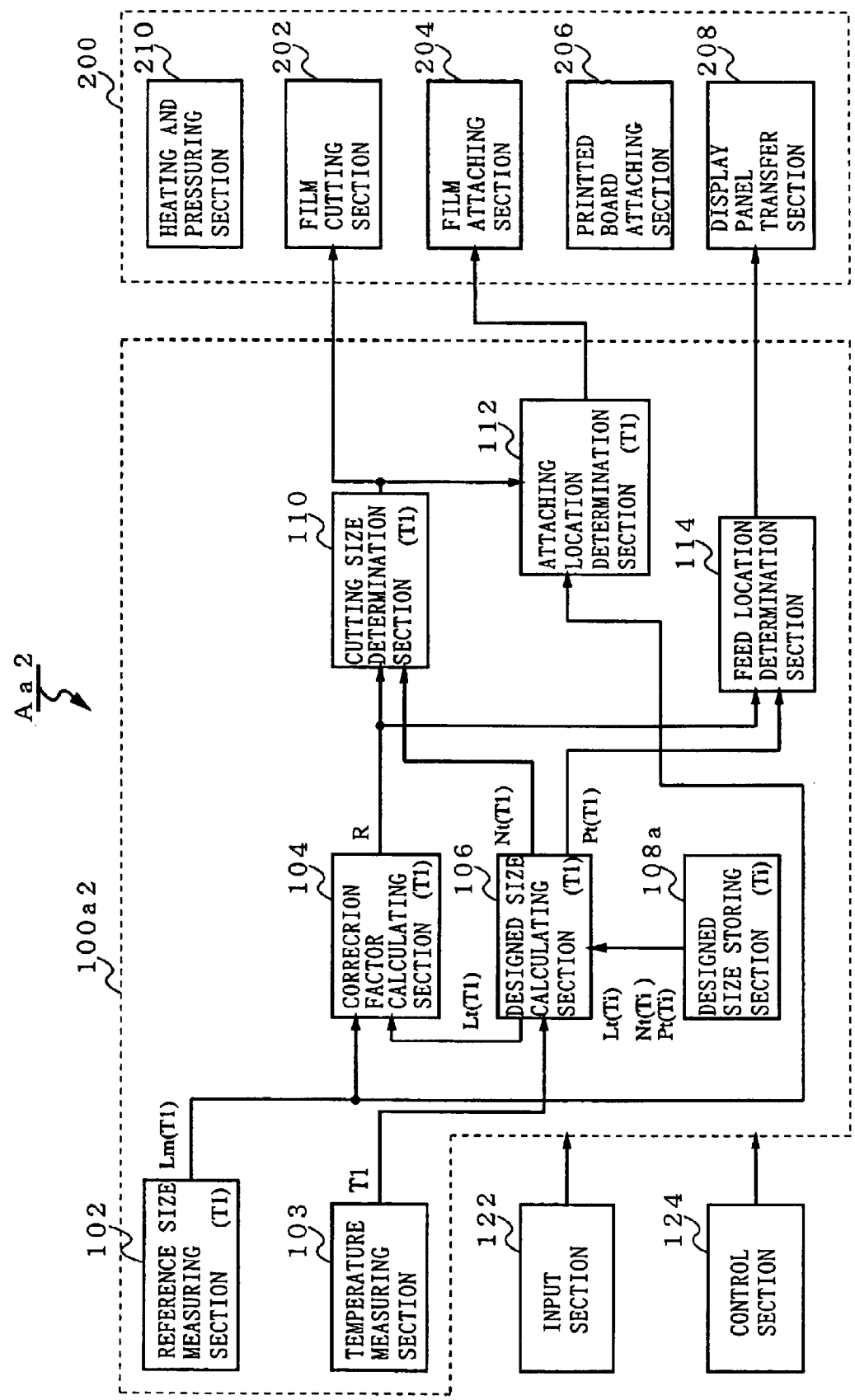
FIG. 3 is a block diagram illustrating a configuration of a variant of the bonding apparatus illustrated in FIG. 1.

FIG. 3 is a block diagram illustrating a variant of the bonding apparatus Aa illustrated in FIG. 1. A bonding apparatus Aa2 illustrated in FIG. 3 measures temperature T1 of the bonding section during an attaching step, and more accurately calculates correction factor R based on designed size Lt(T1) for the measured temperature T1, and measured reference size Lm(T1). Accordingly, the bonding apparatus Aa2 is configured so as to include a designed size storing section 108a, rather than the designed size storing section 108 included in the bonding apparatus Aa, and additionally include a temperature measuring section 103 and a designed size calculating section 106.

Hereinbelow, the bonding apparatus Aa2 will be described in detail. It should be noted that elements similar to those included in the bonding apparatus Aa illustrated in FIG. 1 are denoted by similar reference numerals, and description thereof is omitted.

The temperature measuring section 103 measures the temperature T1 of the bonding portion 8. The designed size storing section 108a stores the following designed sizes for an arbitrary temperature Ti: alignment mark distance Lt(Ti); length Nt (Ti) of the anisotropic conductive film 4; and bonding mark pitch Pt(Ti). Based on the temperature T1 measured by the temperature measuring section 103, and thermal expansion coefficients of the display panel 1 and the anisotropic conductive film 4, the designed size calculating section 106 calculates designed sizes for the measured temperature T1, i.e., the alignment mark distance Lt(T1), the length Nt (T1) of the anisotropic conductive film 4, and the bonding portion pitch Pt(T1).

Figure 4:
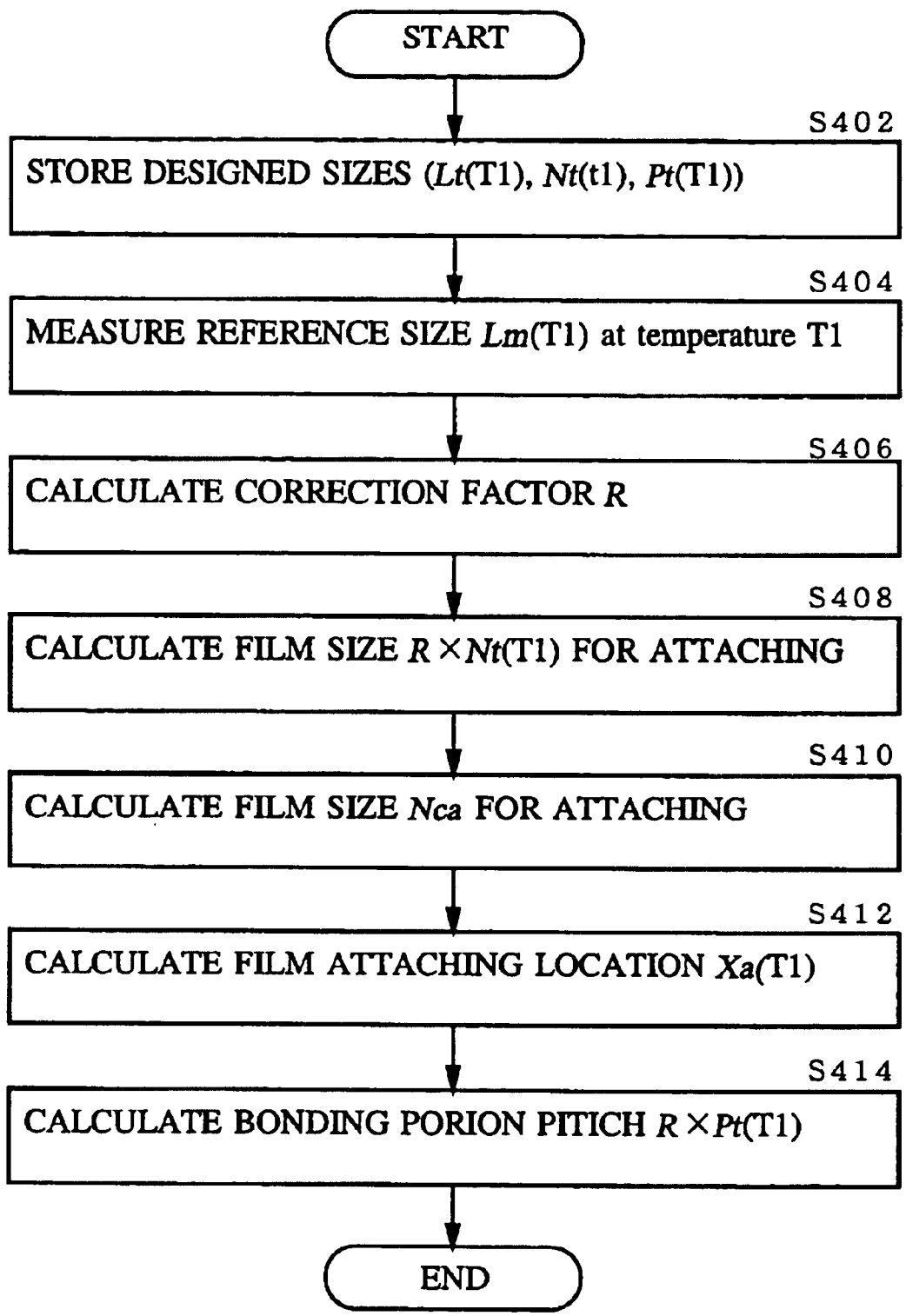
FIG. 4 is a flowchart illustrating an operation of a processing size determination device illustrated in FIG. 2.

Next, a processing size determination operation performed by the bonding apparatus Aa is described with reference to a flowchart illustrated in FIG. 4.

At step S402, the designed size storing section 108a stores alignment mark distance Lt(T1), length Nt(T1) of the anisotropic conductive film 4, and bonding portion pitch Pt(T1), which are designed sizes for environmental temperature T1 (about 80° C.) in the attaching step and previously received by the input section 122. The above-described designed sizes stored in the designed size storing section 108a are also used in subsequent processes unless otherwise changed. Accordingly, it is not necessary to input designed sizes each time the processing size determination operation is performed.

At step S404, the reference size measuring section 102 measures reference size Lm(T1) which is a distance between the alignment marks 3a and 3b of the bonding portion 8 to which the anisotropic conductive film 4 is to be attached.

At step S406, the correction factor calculating section 104 reads alignment mark distance Lt(T1) from the designed size storing section 108a, and calculates correction factor R which corresponds to a ratio of the reference size Lm (T1) measured by the reference size measuring section 102 to the alignment mark distance Lt (T1).

At step S408, the cutting size determination section 110 reads length Nt (T1) of the anisotropic conductive film 4 from the designed size storing section 108a, and calculates length R×Nt(T1) of the anisotropic conductive film 4 at a temperature T1 based on the correction factor R and the designed size Nt(T1).

At step S410, the cutting size determination section 110 corrects the length Nt(T1) based on the thermal expansion coefficient of the anisotropic conductive film 4 and a difference in temperature between cutting and attaching operations, such that the length of the anisotropic conductive film 4 can be R×Nt(T1) at the temperature T1, and determines cutting size Nca to which the anisotropic conductive film 4 is cut at a temperature of about 25° C.

At step S412, the attaching location determination section 112 determines a location Xa(T1), in which the anisotropic conductive film 4 is attached, based on the distance Lm(T1) between the alignment marks 3a and 3b measured by the reference size measuring section 102, and the cutting size Nca.

At step S414, the feed location determination section 114 reads bonding portion pitch Pt(T1) from the designed size storing section 108a, and calculates the actual bonding portion R×Pt(T1) at the temperature T1, based on the correction factor R and the bonding portion pitch Pt(T1).

It should be noted that lengths and attaching locations of a plurality of anisotropic conductive films 4 to be attached to their respective bonding portions 8 may be determined based on corresponding correction factors R calculated for all the bonding portions 8 or based on a single correction factor R calculated for one of the bonding portions 8. In the case where the lengths and the attaching locations of the plurality of anisotropic conductive films 4 are determined based on the single correction factor R calculated for one of the bonding portions 8, all the plurality of anisotropic conductive films 4 to be attached to their respective bonding portions 8 formed on the same display panel, rather than just one anisotropic conductive film 4 corresponding to that one bonding portion 8, are cut to cutting size Nca determined for that one bonding portion 8, and all the plurality of conductive films 4 are attached using, as a reference, one anisotropic conductive film attaching location for that one bonding portion 8, such that each anisotropic conductive film 4 is attached in a location distanced by pitch (Pt(T1)+ΔP) from the previous attaching location.

The above-described method for determining lengths and attaching locations of a plurality of anisotropic conductive films 4 based on a single correction factor R calculated for one bonding portion 8 should be applied to a plurality of bonding portions 8 formed on a single display panel at a time. In the case where all the plurality of bonding portions 8 are formed on the single display panel 1 at several times, an alignment mark distance may be detected at least for each set of bonding portions 8 formed at a time in order to accurately determine the lengths and the attaching locations of all the plurality of anisotropic conductive films 4.

Further, in the case where the plurality of anisotropic conductive films 4 are attached to the bonding portions 8 each having a set of circuit electrodes 2 formed with high density and high precision, an alignment mark distance may be measured for each bonding position 8 for determining lengths and attaching locations of the plurality of anisotropic conductive films 4.

Although the present embodiment has been described with respect to the case of using the anisotropic conductive films 4, thermosetting resin films may be used instead of using the anisotropic conductive films 4. In such a case, attaching operations can be performed in accordance with the same procedures as those used for attaching the anisotropic conductive films 4.

When an attaching location of one of printed boards 6 to be attached to the display panel 1 is determined, attaching locations of the rest of printed boards 6 may be determined based on bonding portion pitch (Pt(T1)+ΔP) calculated for attaching an anisotropic conductive film 4.

In the case where the anisotropic conductive film 4 is used as a bonding film, electrical connections can be secured owing to conductivity of the anisotropic conductive film 4 even if the conductor 7 and the circuit electrodes 2 are not in direct contact with each other. However, in the case where the thermosetting resin film is used as a bonding film, the thermosetting film itself is not conductive, and therefore it is necessary to heat and pressurize the thermosetting film until the circuit electrodes 2 and the conductor 7, which should be bonded together, break the thermosetting film attached therebetween by pressure, and come into direct contact with each other, and thereafter it is also necessary to further heat the thermosetting film so as to complete bonding between the circuit electrodes 2 and the conductor 7 in a state where electrical connections are secured.

As described above, the processing size determination device according to the present embodiment calculates correction factors each corresponding to an error in the size of a display panel measured in a bonding step with respect to a designed size. A cutting size and an attaching location of the anisotropic conductive film are determined by correcting designed values for the length and the attaching location of the anisotropic conductive film based on the calculated correction coefficient. Thus, even if respective sizes of display panels targeted for bonding are different, the anisotropic conductive films can be cut to proper lengths, and attached in proper locations.

However, in some cases, even if the anisotropic conductive film has a proper length immediately after an attaching operation, the anisotropic conductive film and the display panel contract at room temperature, and therefore the length of the anisotropic conductive film becomes shorter than that of a bonding portion to be covered by the anisotropic conductive film during use at room temperature. In such a case, there is a possibility that connections between the circuit electrodes 2 and the printed board 6 provided by using the anisotropic conductive film 4 might not be ensured at room temperature.

Second Embodiment

A processing size determination device according to a second embodiment of the present invention is characterized by determining a cutting size and an attaching location of an anisotropic conductive film based on variations in sizes of a display panel and the anisotropic conductive film due to a difference in temperature level between an attaching step and use of the display panel. In the present embodiment, the temperature during use of the display panel is T2, and room temperature is about 25° C.

A bonding apparatus according to the second embodiment for bonding circuit electrodes is configured to include a designed size storing section 108b, a cutting size determination section 110b, and an attaching location determination section 112b, instead of the designed size storing section 108a, the cutting size determination section 110, and the attaching location determination section 112, which are described in the first embodiment. The bonding apparatus according to the, second embodiment additionally includes a thermal shrinkage calculating section 116b. It should be noted that elements similar to those described in the first embodiment are denoted by similar reference numerals, and description thereof is omitted.

Figure 5:
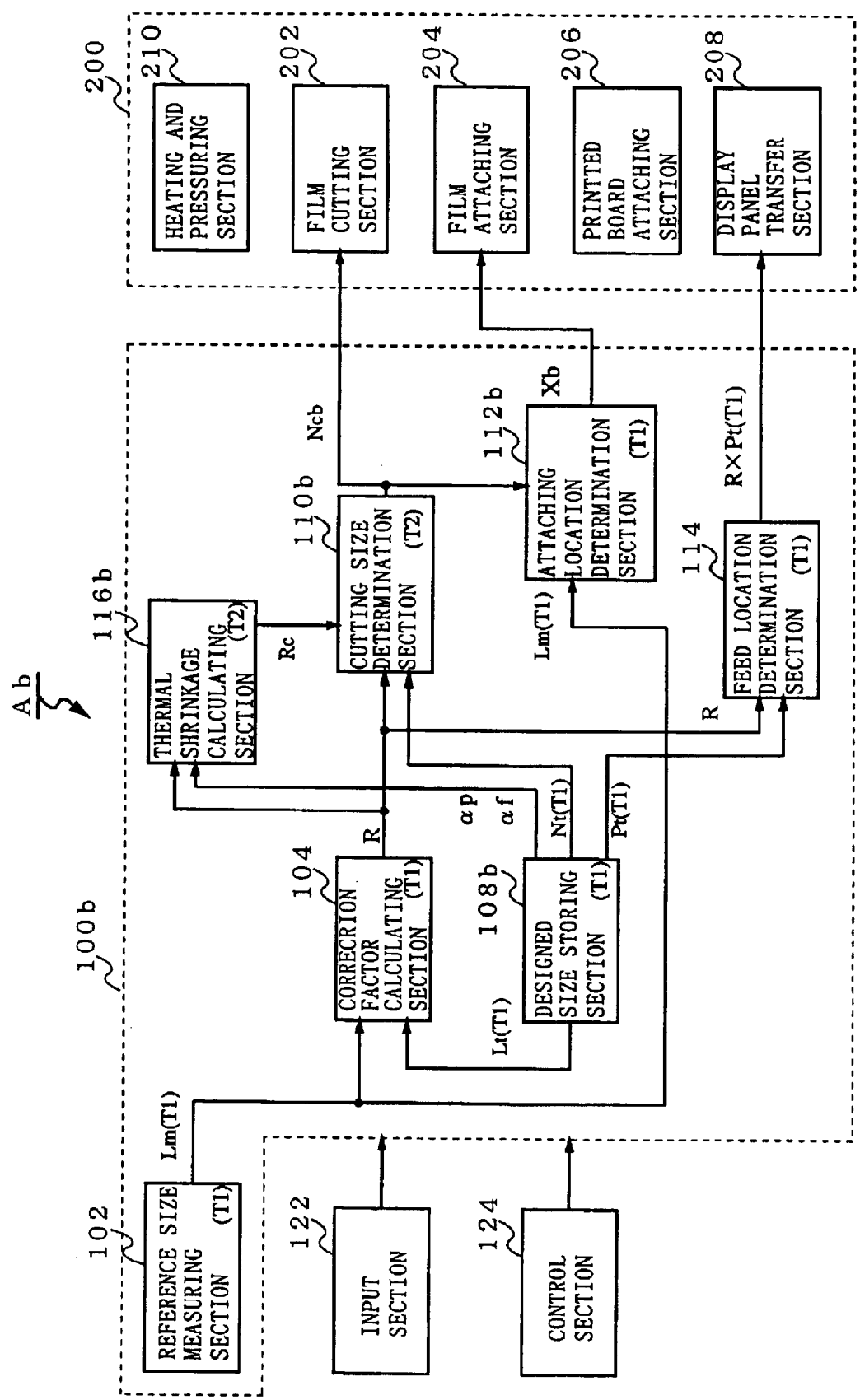
FIG. 5 is a block diagram illustrating a configuration of a bonding apparatus according to a second embodiment of the present invention having a processing size determination device incorporated therein.

FIG. 5 is a block diagram illustrating a configuration of a bonding apparatus Ab according to the second embodiment having a processing size determination device incorporated therein. Although a variant of the bonding apparatus Ab according to the present embodiment may be configured as in the case of the variant (FIG. 3) according to the first embodiment, description of such a variant is omitted herein.

The processing size determination section 100b includes a reference size measuring section 102, a correction factor calculating section 104, the designed size storing section 108b, the cutting size determination section 110b, the attaching location determination section 112b, a feed location determination section 114, the thermal shrinkage calculating section 116b, an input section 122, and a control section 124.

The designed size storing section 108b prestores the following designed sizes for temperature T1: alignment mark distance Lt (T1) which is a distance between alignment marks 3a and 3b; length Nt (T1) of an anisotropic conductive film 4; and bonding portion pitch Pt (T1). The designed size storing section 108b further prestores thermal expansion coefficient $\alpha p$ of a display panel 1, and thermal expansion coefficient $\alpha f$ of the anisotropic conductive film 4.

The thermal shrinkage calculating section 116b calculates correction factor Rc, which corresponds to a thermal shrinkage ratio of the length of the anisotropic conductive film 4 to the size of the display panel 1 when temperature varies from T1 to T2, based on the thermal expansion coefficient $\alpha p$ of the display panel 1, and the thermal expansion coefficient $\alpha f$ of the anisotropic conductive film 4, which are stored in the designed size storing section 108b.

The cutting size determination section 110b reads the designed length Nt(T1) of the anisotropic conductive film 4 from the designed size storing section 108b, and calculates the length to which the anisotropic conductive film 4 is cut, such that the length of the anisotropic conductive film 4 becomes proper at temperature T2, based on the correction factor Rc, correction factor R, and the designed length Nt(T1). Specifically, the length of the anisotropic film 4 at the temperature T1, which is corrected so as to be suitably adapted for the actual alignment mark distance Lm at the temperature T2, is calculated by Rc×R×Nt(T1). Based on the thermal expansion coefficient of the anisotropic conductive film 4, and temperature variation, the cutting size determination section 110b determines cutting size Ncb to which the anisotropic conductive film 4 is cut at a temperature of about 25° C., such that the length of the anisotropic conductive film 4 can be Rc×R×Nt(T1) at the temperature T1.

The attaching location determination section 112b determines a location in which the anisotropic conductive film 4 is attached, based on the alignment mark distance Lm(T1) measured by the reference size measuring section 102, and the cutting size Ncb. Specifically, the attaching location determination section 112b sets distance Xb from the alignment mark 3a to the anisotropic conductive film 4 such that the center of the anisotropic conductive film 4 is positioned at a midpoint between the alignment marks 3a and 3b. The distance Xb from the alignment mark 3a to the anisotropic conductive film 4 is obtained by the following expression 3.

$$Xb=(Lm(T1)-Ncb)\div 2 \tag{3}$$

Figure 6:
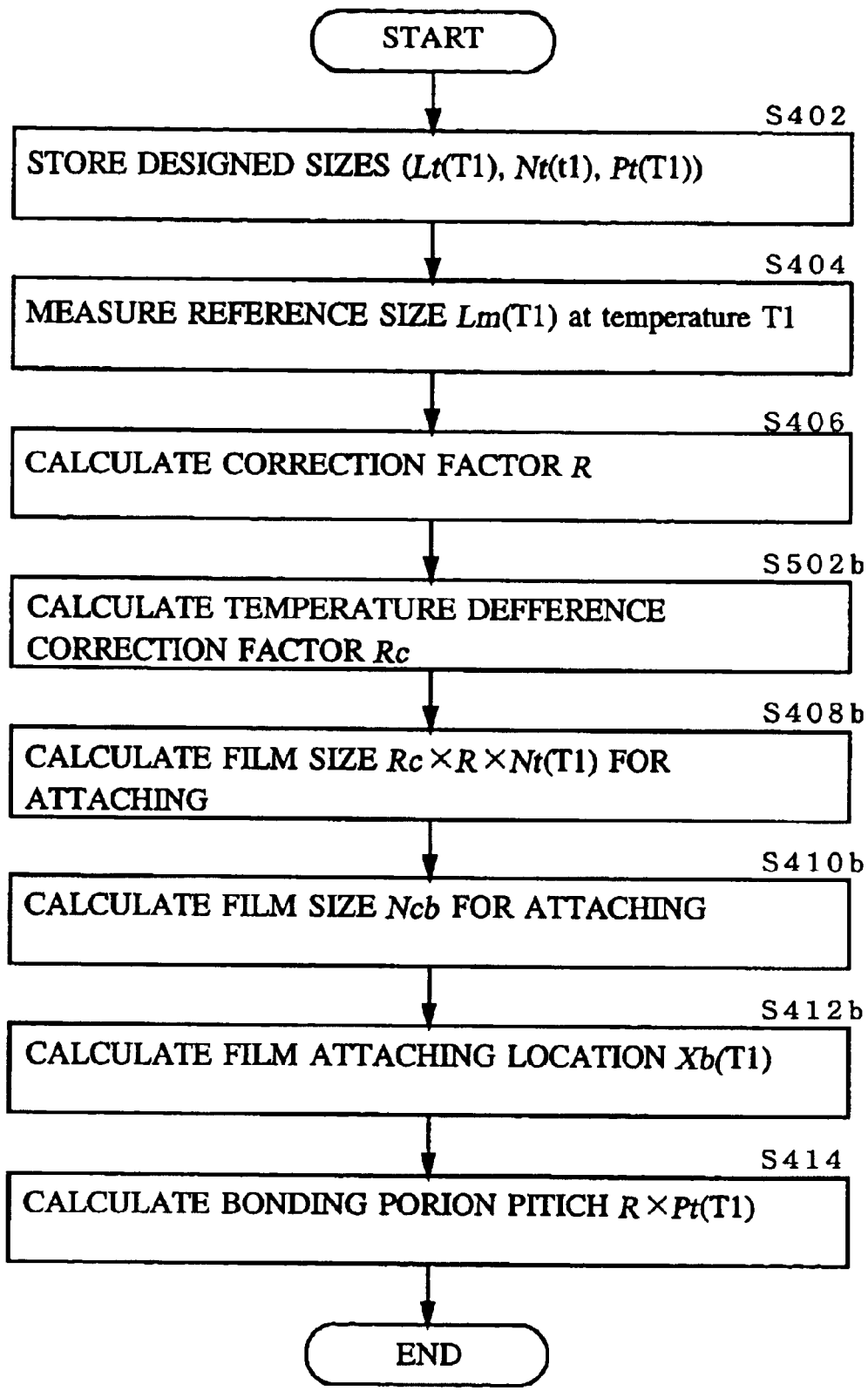
FIG. 6 is a flowchart illustrating an operation of a processing size determination device illustrated in FIG. 5.

Next, a processing size determination operation performed by the bonding apparatus Ab is described with reference to a flowchart illustrated in FIG. 6. The flowchart illustrated in FIG. 6 is similar to the flowchart illustrated in FIG. 4 except that steps S408, S410, and S412 of FIG. 4 are replaced with steps S408b, S410b, and S412b, and step S502b is additionally included. The same steps as those illustrated in FIG. 4 are denoted by the same step numbers, and description thereof is omitted.

At step S502b following step S406, the thermal shrinkage calculating section 116b calculates correction factor Rc, which corresponds to a thermal shrinkage ratio of the length of the anisotropic conductive film 4 to the size of the display panel 1 when temperature of the display panel 1 varies from temperature T1 to temperature T2 which corresponds to that during use of the display panel 1, based on the thermal expansion coefficient $\alpha p$ of the display panel 1, and the thermal expansion coefficient $\alpha f$ of the anisotropic conductive film 4, which are stored in the designed size storing section 108b.

At step S408b, the cutting size determination section 110b reads designed length Nt(T1) of the anisotropic conductive film 4 from the designed size storing section 108b, and calculates length Rc×R×Nt(T1) of the anisotropic conductive film 4 at a temperature T1 based on the correction factors Rc and R, and the designed length Nt(T1).

At step S410b, the cutting size determination section 110b calculates cutting size Ncb to which the anisotropic conductive film 4 is cut at a temperature of about 25° C., such that the length of the anisotropic conductive film 4 can be Rc×R×Nt(T1) at the temperature T1.

At step S412b, the attaching location determination section 112b determines a location in which the anisotropic conductive film 4 is attached, based on the alignment mark distance Lm(T1) measured by the reference size measuring section 102, and the cutting size Ncb. Specifically, the attaching location determination section 112b calculates distance Xb from the alignment mark 3a to the anisotropic conductive film 4 such that the center of the anisotropic conductive film 4 is positioned at a midpoint between the alignment marks 3a and 3b.

As described above, according to the present embodiment, the cutting length of an anisotropic conductive film is determined such that the display panel 1 and the anisotropic conductive film 4 after bonding can have prescribed lengths during use even when the lengths of the display panel 1 and the anisotropic conductive film 4 vary due to a difference in level between an environmental temperature T1 and working temperature T2 during an attaching step. Thus, it is possible to prevent occurrence of malfunction, e.g., the anisotropic conductive film which has been elongated by thermal expansion is brought into contact with an alignment mark on the display panel, and therefore the location of the alignment mark is made undetectable.

However, there is a possibility that an error in length or an attaching location of an anisotropic conductive film might be caused due to variation in operation of a device for cutting or attaching, i.e., variation in lengths to which anisotropic conductive films are cut by a processing section or variation in locations in which the anisotropic conductive films are attached by a film placing section. The above-described error leads to variations in cutting length and attaching locations of the anisotropic conductive films, and therefore it is not completely ensured that each anisotropic conductive film covers a corresponding one of bonding portions so as not to be in contact with an alignment mark on the display panel.

Third Embodiment

A circuit electrode bonding method according to a third embodiment of the present invention is characterized by correcting errors in operations performed by a bonding apparatus for cutting and attaching anisotropic conductive films. A processing size determination apparatus according to the present embodiment is configured so as to include a cutting size determination section 110c and an attaching location determination section 112c, instead of the cutting size determination section 110b and the attaching location determination section 112b, which are described in the second embodiment. The processing size determination apparatus according to the present embodiment additionally includes a processing error storing section 118c. It should be noted that elements similar to those described in the second embodiment are denoted by similar reference numerals, and description thereof is omitted.

Figure 7:
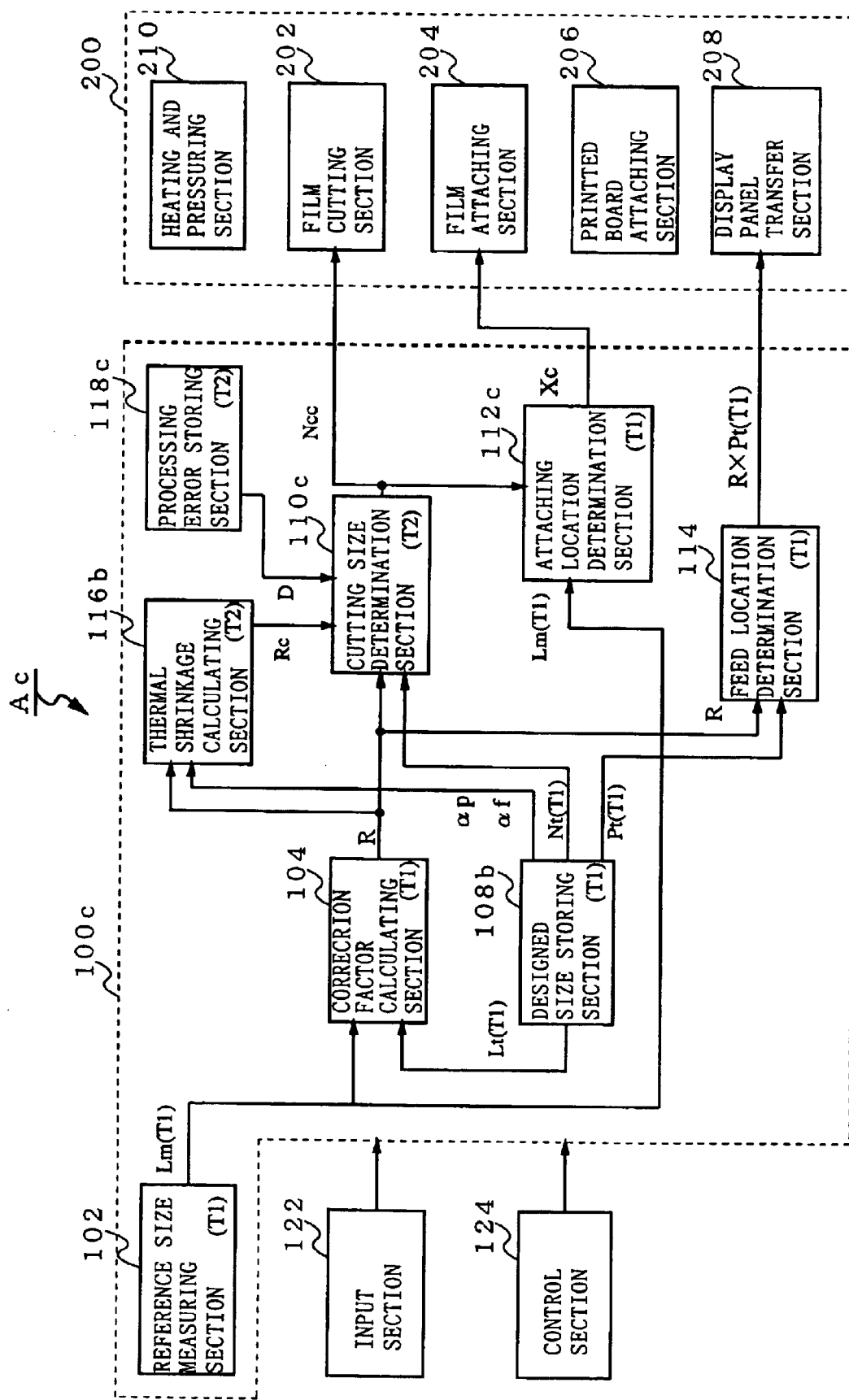
FIG. 7 is a block diagram illustrating a configuration of a bonding apparatus according to a third embodiment of the present invention having a processing size determination device incorporated therein.

FIG. 7 is a block diagram illustrating a configuration of a bonding apparatus Ac according to the third embodiment having a processing size determination device incorporated therein. Although a variant of the bonding apparatus Ab according to the present embodiment may be configured as in the case of the variant (FIG. 3) according to the first embodiment, description of such a variant is omitted herein.

The processing size determination section 100c includes a reference size measuring section 102, a correction factor calculating section 104, a designed size storing section 108b, the cutting size determination section 110c, the attaching location determination section 112c, a feed location determination section 114, a thermal shrinkage calculating section 116b, the processing error storing section 118c, an input section 122, and a control section 124.

The processing error storing section 118c prestores step capability error D which is an error in actual lengths of anisotropic conductive films 4 at the time of an attaching operation, and is resulted from variations in operations of a processing operation section 200 performed on the anisotropic conductive films 4.

The cutting size determination section 110c reads the designed length Nt(T1) of an anisotropic conductive film 4 at a temperature T1 from the designed size storing section 108b, and calculates the length to which the anisotropic conductive film 4 is cut, based on correction factor Rc, correction factor R, and the designed length Nt(T1). Specifically, the length of the anisotropic film 4 at the temperature T1, which is corrected so as to be suitably adapted for the actual alignment mark distance Lm at a temperature T2, is calculated by Rc×R×Nt(T1)−D. Based on the thermal expansion coefficient of the anisotropic conductive film 4, and temperature variation, the cutting size determination section 110c determines cutting size Ncc to which the anisotropic conductive film 4 is cut at a temperature of about 25° C., such that the length of the anisotropic conductive film 4 can be Rc×R×Nt(T1)−D at the temperature T1.

The attaching location determination section 112c determines a location in which the anisotropic conductive film 4 is attached, based on the alignment mark distance Lm(T1) measured by the reference size measuring section 102, and the cutting size Ncc. Specifically, the attaching location determination section 112c sets distance Xc from an alignment mark 3a to the anisotropic conductive film 4 such that the center of the anisotropic conductive film 4 is positioned at a midpoint between a set of alignment marks 3a and 3b. The distance Xc from the alignment mark 3a to the anisotropic conductive film 4 is obtained by the following expression 4.

$$Xc = (Lm(T1) - Ncc) \div 2 \qquad (4)$$

Figure 8:
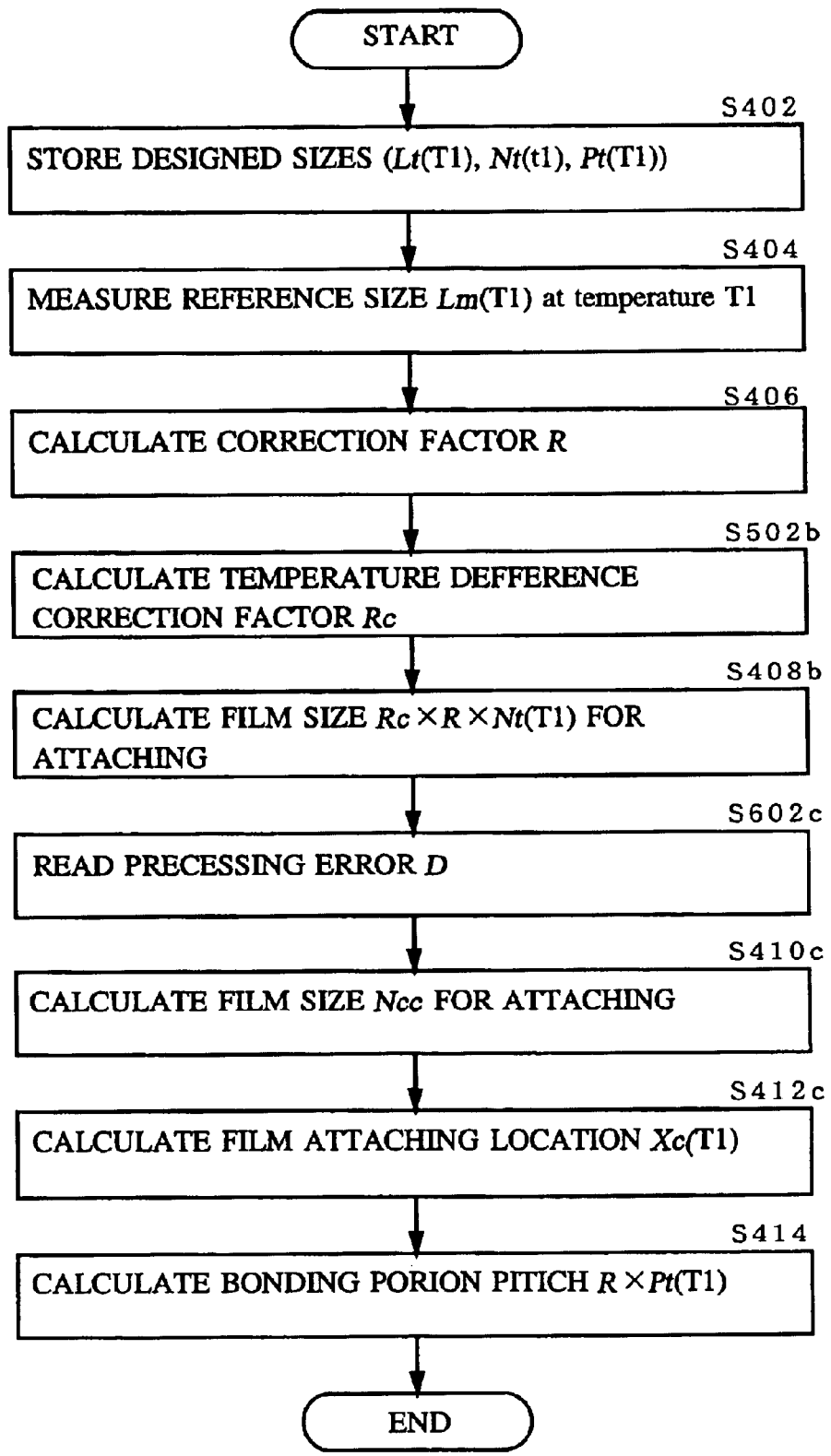
FIG. 8 is a flowchart illustrating an operation of a processing size determination device illustrated in FIG. 7.

Next, a processing size determination operation performed by the bonding apparatus Ac is described with reference to a flowchart illustrated in FIG. 8. The flowchart illustrated in FIG. 8 is similar to the flowchart illustrated in FIG. 6 except that steps S410b and S412b of FIG. 6 are replaced with steps S410c and S412c, and step S602c is additionally included. The same steps as those illustrated in FIG. 6 are denoted by the same step numbers, and description thereof is omitted.

At step S602c following step S408b, the cutting size determination section 110c reads step capability error D from the processing error storing section 118c.

At step S410c, the cutting size determination section 110c calculates cutting size Ncc to which the anisotropic conductive film 4 is cut at a temperature of about 25° C., such that the length of the anisotropic conductive film 4 can be Rc×R×Nt(T1)−D at the temperature T1.

At step S414, the attaching location determination section 112c determines a location in which the anisotropic conductive film 4 is attached, based on the alignment mark distance Lm(T1) measured by the reference size measuring section 102, and the cutting size Ncc. Specifically, the attaching location determination section 112c calculates distance Xc from the alignment mark 3a to the anisotropic conductive film 4 such that the center of the anisotropic conductive film 4 is positioned at a midpoint between the alignment marks 3a and 3b.

As described above, according to the present embodiment, a cutting size of an anisotropic conductive film is determined such that the anisotropic conductive film can have a prescribed length after being attached even if the actual length of the anisotropic conductive film, which has been cut by a film cutting section and attached by a film attaching section, varies from the cutting size determined by a processing size determination section. Thus, it is possible to prevent occurrence of malfunction, e.g., the anisotropic conductive film which has been elongated by thermal expansion is brought into contact with an alignment mark on the display panel, and therefore the location of the alignment mark is made undetectable, or the length of the anisotropic conductive film is shorter than the length of the bonding portion.

Fourth Embodiment

In a fourth embodiment of the present invention, a creamy conductive resin paste 12 is used as a bonding material. A bonding apparatus according to the fourth embodiment will be described with reference to FIGS. 9 and 10. The bonding apparatus according to the fourth embodiment performs measurement of reference size Lm(T1), calculation of correction factor R, and the length and an attaching location of an anisotropic conductive film 4 as performed in the above-described first embodiment.

Figure 9:
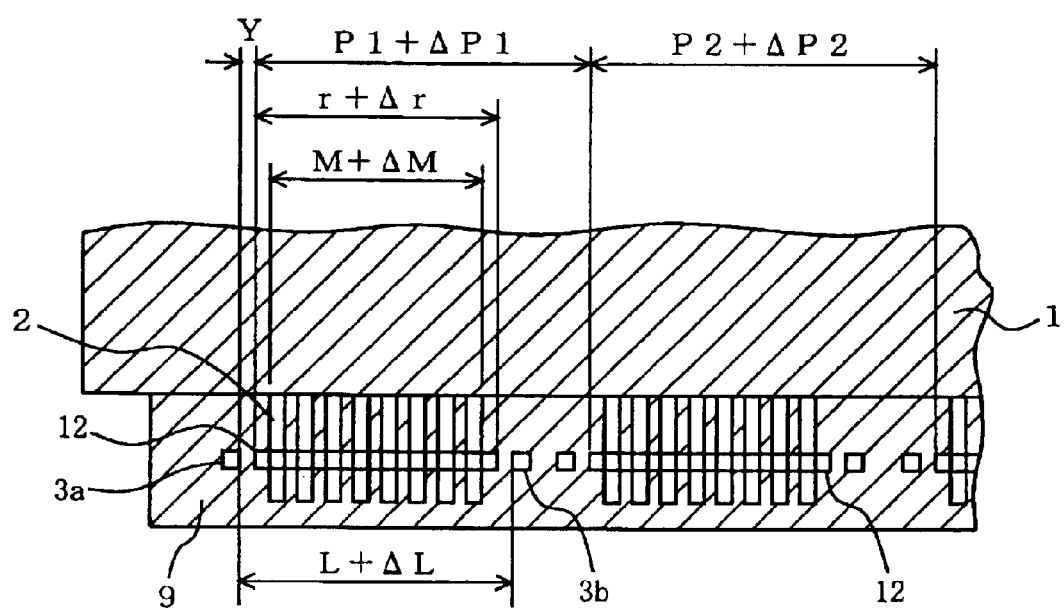
FIG. 9 is a schematic view showing a discharge size and a discharge location of a conductive resin paste according to a fourth embodiment of the present invention.
Figure 10:
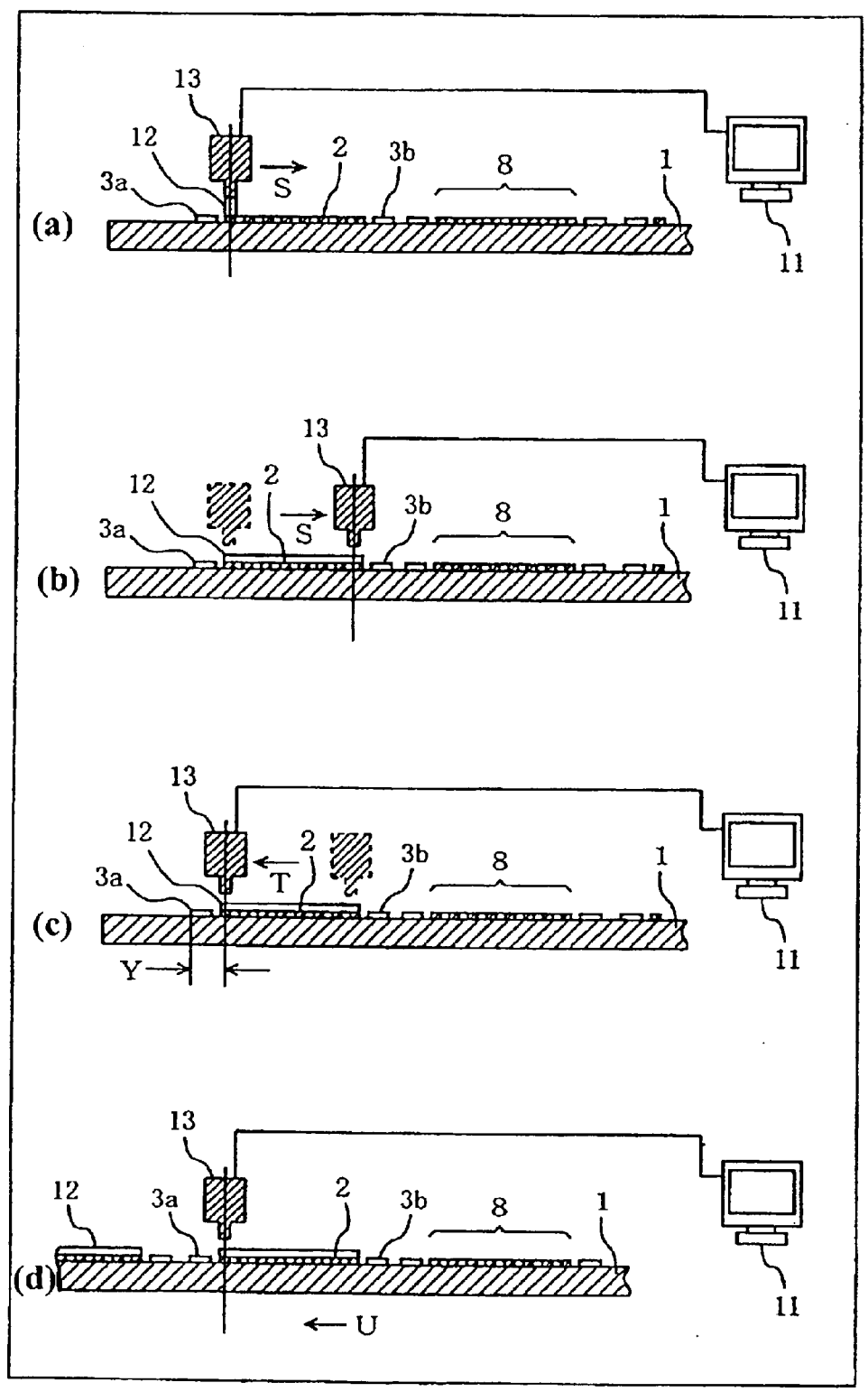
FIG. 10 is a schematic view illustrating an operation of a bonding apparatus according to the fourth embodiment of the present invention.
Figure 11:
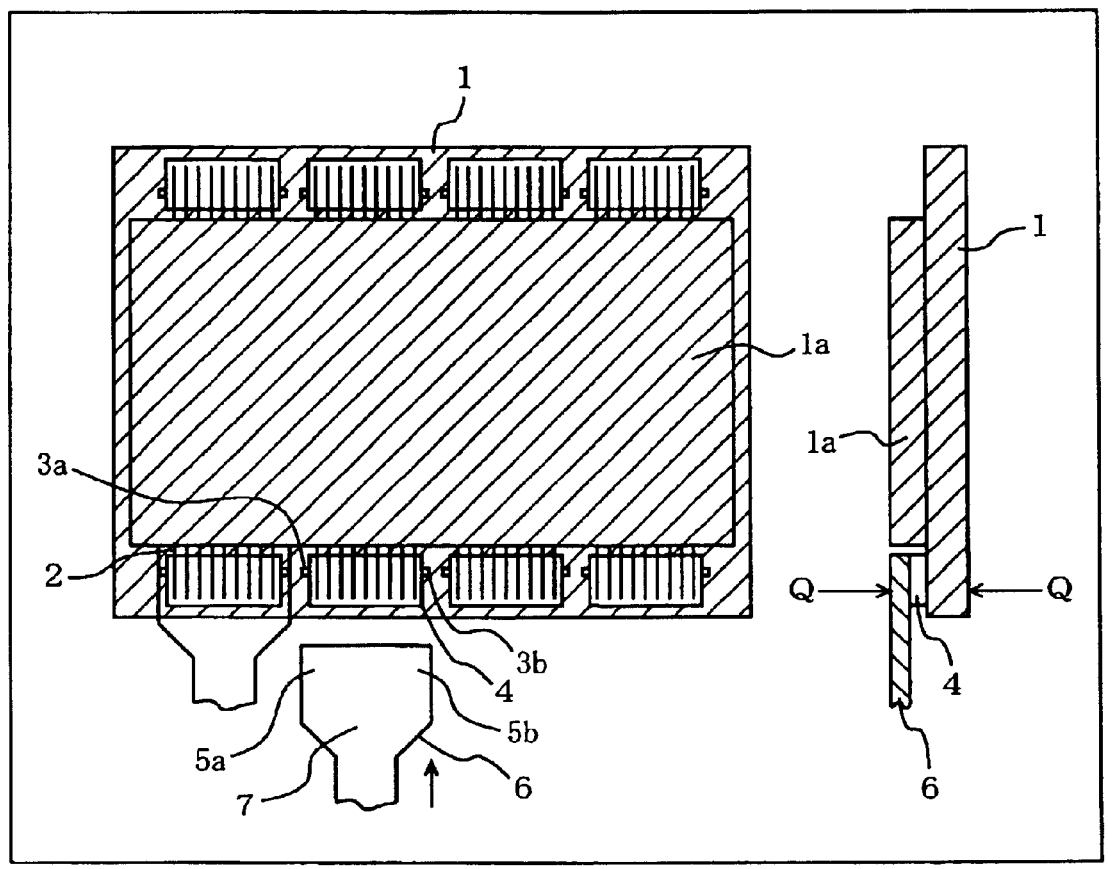
FIG. 11 is a view illustrating a basic configuration in which a display panel and a printed board are bonded together using an anisotropic conductive film.
Figure 12:
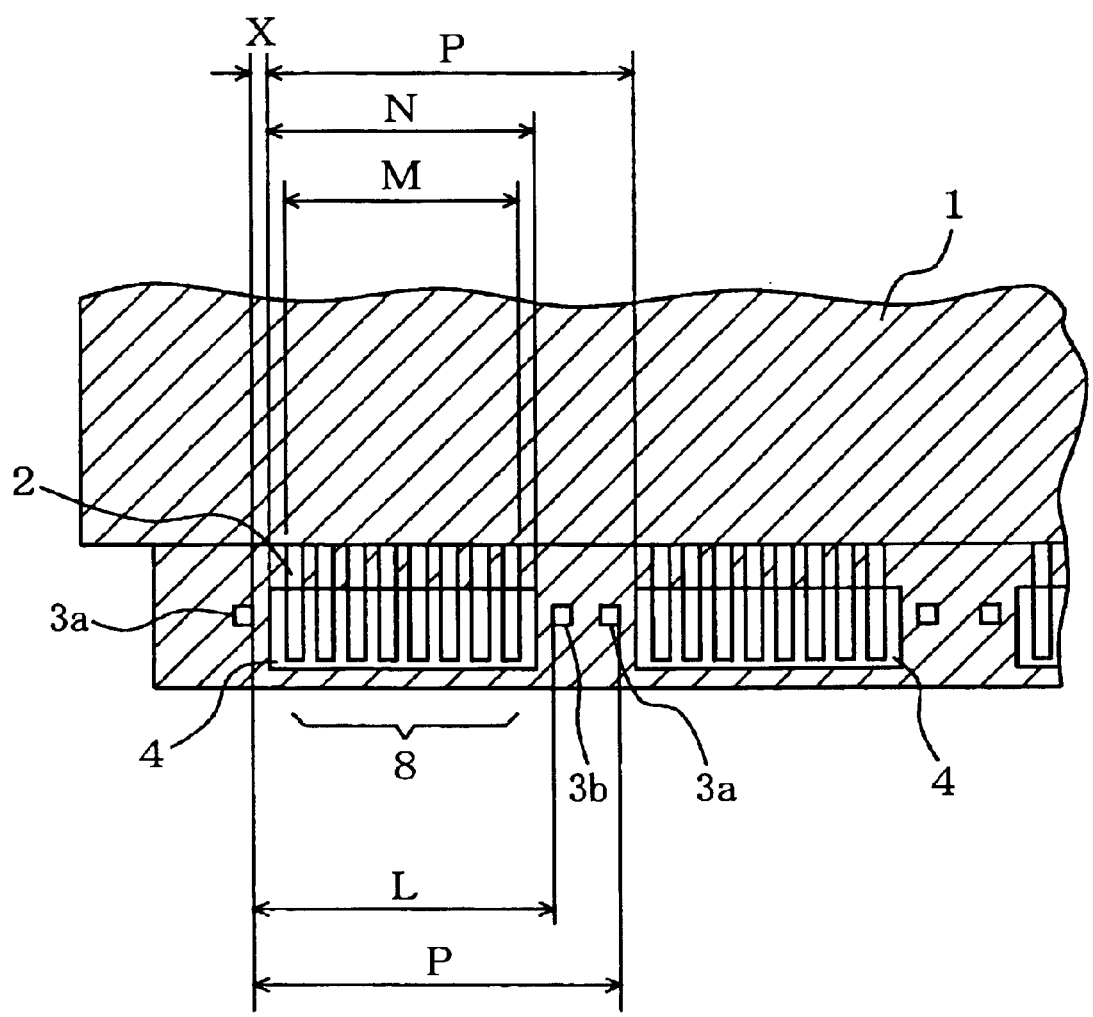
FIG. 12 is a schematic view showing designed sizes of a bonding portion of a display panel and an anisotropic conductive film.
Figure 13:
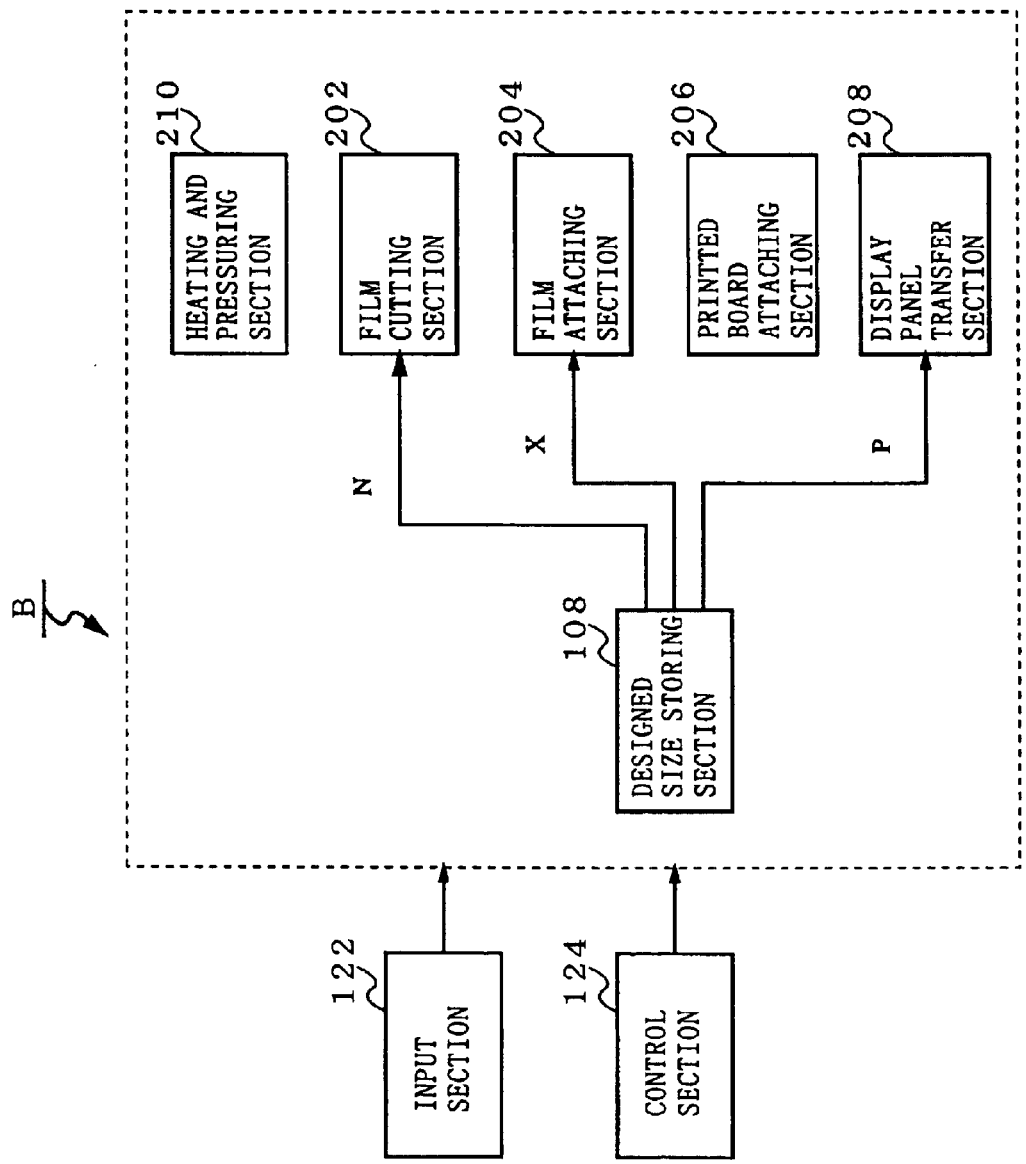
FIG. 13 is a block diagram illustrating a configuration of a conventional bonding apparatus.

In FIG. 9, the conductive resin paste 12 is used as a bonding material for bonding a display panel 1 and a printed board 6. When the conductive resin paste 12 is subjected to a thermocompression process, conductive properties and insulative properties are imparted to compressed portions of the conductive resin paste 12 in a through-plane direction (a thickness direction) and an in-plane direction (a length direction), respectively.

In FIG. 9, the length of the conductive resin paste 12 applied to a bonding portion 8 is indicated by a discharge length ($\gamma+\Delta\gamma$), and a distance from an alignment mark 3a from the conductive resin paste 12 is indicated by a discharge location Y.

Referring to FIG. 10(a), a discharging unit 13 is moved from the alignment mark 3a, which is a discharging operation start point, to a location distanced by Y from the alignment mark 3a in accordance with an instruction of a calculation control unit 11. After such movement, the discharging unit 13 discharges the conductive resin paste while moving by the discharge length ($\gamma+\Delta\gamma$) to the direction indicated by arrow S, and then stops the discharge and movement (FIG. 10(b)). Thereafter, the discharging unit 13 moves back to the location distanced by Y from the alignment mark 3a, i.e., the discharging operation start point, along the direction indicated by arrow T, and is put on standby for discharging an adjacent bonding portion (FIG. 10(c)).

The display panel 1 is interlocked with the movement of the discharging unit 13 to the discharging operation start point Y so as to be moved by the distance ($\gamma+\Delta\gamma$) to the direction indicated by arrow U, so that a discharging operation start point Y for the adjacent bonding portion is aligned with the discharging unit 13. Locations of a plurality of bonding portions are calculated by using estimated size ($\gamma n+\Delta\gamma n$), and discharging of the conductive resin paste 12 is performed at these locations in the above-prescribed procedure.

After the completion of discharging of the conductive resin paste 12 to the bonding portions, the printed board 6 and the display panel 1 can be bonded in a manner as described in conjunction with the first embodiment.

Note that the conductive resin paste 12 is creamy, viscous, and thixotropic, i.e., the conductive resin paste 12 has a property of being influenced by ambient temperature, and therefore it is preferable to use the conductive resin paste 12 after conducting a discharging test to check whether the conductive resin paste 12 can be properly discharged. If necessary, suitable correction is made before using the conductive resin paste 12.

In the case where the conductive resin paste 12 is used, circuit electrodes 2 on the display panel 1 and a conductor 7 of the printed board 6, which should be bonded together, can be electrically connected due to the conductivity of the conductive resin paste 12 even if the circuit electrodes 2 and the conductor 7 are not directly in contact with each other.

Alternatively, a thermosetting resin paste may be used as a bonding material. In such a case, the thermosetting resin paste itself is not conductive, and therefore it is necessary to bond the circuit electrodes 2 and the conductor 7 together in a state where the circuit electrodes 2 and the conductor 7 are in direct contact and electrical connections are secured. Thus, it is necessary to pressurize the circuit electrodes 2 and the conductor 7 until the circuit electrodes 2 and the conductor 7 push aside the thermosetting resin paste so as to come into contact with each other and secure electrical connections, and thereafter it is also necessary to heat the thermosetting resin paste with the pressure being maintained on the circuit electrodes 2 and the conductor 7, in order to cure the thermosetting resin paste.

Note that the bonding apparatus according to the present invention may be configured to include a variety of processing means as described above as a unit on a single platform or as separate units connected together.

While the invention has been described in detail, the foregoing description is in all aspects illustrative and not restrictive. It is understood that numerous other modifications and variations can be devised without departing from the scope of the invention.

What is claimed is:

1. A circuit electrode bonding apparatus comprising:
    a measuring section for measuring a size of a bonding portion of a circuit electrode;
    a comparing section for comparing the measured size of the bonding portion with a designed size of the bonding portion;
    a size determination section for determining a processing size of a bonding material based on a comparison result of the comparing section;
    a processing section for processing the bonding material to the processing size;
    a mounting section for mounting the processed bonding material over the bonding portion; and
    a location determination section for determining a location of the bonding portion for mounting the processed bonding material based on the comparison result.

2. A circuit electrode bonding apparatus according to claim 1, wherein the measuring section measures the size of the bonding portion of the circuit electrode at a bonding temperature at which the processed bonding material is to be bound to the bounding portion.

3. A circuit electrode bonding apparatus according to claim 2, wherein the comparing section compares the measured size of the bonding portion at the bonding temperature with the designed size of the bonding portion at the bonding temperature and generates a ratio of the measured size and the designed size as the comparison result.

4. A circuit electrode bonding apparatus according to claim 3, wherein the size determination section determines the processing size of the bonding material at a processing temperature at which the processing section processes the bonding material by multiplying the comparison result, a designed size of the bonding material at the bonding temperature, and a thermal expansion coefficient.

5. A circuit electrode bonding apparatus according to claim 4, wherein the location determination section determines the location of the bonding portion for bonding the processed bonding material by multiplying a designed size of a pitch of the bonding portion by the comparison result.

6. A circuit electrode bonding apparatus according to claim 3, wherein the bonding temperature is higher than the processing temperature.

7. A circuit electrode bonding apparatus according to claim 3, wherein the bonding temperature is approximately 80° C. and the processing temperature is approximately 25° C.

8. A circuit electrode bonding apparatus according to claim 1, wherein the location determination section determines the location of the bonding portion for bonding the processed bonding material by multiplying a designed size of a pitch of the bonding portion by the comparison result.

9. A circuit electrode bonding apparatus according to claim 1, wherein the bonding material is an anisotropic conductive film.

10. A circuit electrode bonding apparatus according to claim 9, wherein the processing section processes the anisotropic conductive film to the processing size by cutting the anisotropic conductive film.

* * * * *